United States Patent

Azdasht et al.

[11] Patent Number: 5,977,512
[45] Date of Patent: Nov. 2, 1999

[54] MULTI-WAVELENGTH LASER SOLDERING DEVICE WITH SUBSTRATE CLEANING BEAM

[75] Inventors: Ghassem Azdasht; Martin Lange, both of Berlin, Germany

[73] Assignee: Fraunhofer-Gesellschaft Zur Forderung der Angewandten Forschung EV, Munich, Germany

[21] Appl. No.: 08/875,722

[22] PCT Filed: Sep. 17, 1996

[86] PCT No.: PCT/EP96/04067

§ 371 Date: Jul. 31, 1997

§ 102(e) Date: Jul. 31, 1997

[87] PCT Pub. No.: WO97/20654

PCT Pub. Date: Jun. 12, 1997

[30] Foreign Application Priority Data

Dec. 1, 1995 [DE] Germany ............................ 195 44 929

[51] Int. Cl.[6] .................................................. B23K 26/00
[52] U.S. Cl. ............................... 219/121.63; 219/121.68; 219/121.76; 219/121.84
[58] Field of Search ............................ 219/121.61, 121.6, 219/121.63, 121.64, 121.65, 121.66, 121.68, 121.69, 121.76, 121.85, 121.84

[56] References Cited

U.S. PATENT DOCUMENTS

| 5,193,738 | 3/1993 | Hayes .............................. 219/121.85 X |
| 5,272,309 | 12/1993 | Goruganthu et al. .............. 219/121.63 |
| 5,484,979 | 1/1996 | Gao .................................... 219/121.64 |

FOREIGN PATENT DOCUMENTS

| 0625796A2 | 11/1994 | European Pat. Off. . |
| 3939812A1 | 6/1991 | Germany . |
| 19511392A1 | 5/1995 | Germany . |
| 5-42382 | 2/1993 | Japan . |
| 07171689A | 7/1995 | Japan . |
| WO95/00279 | 5/1995 | WIPO . |

*Primary Examiner*—Gregory Mills
*Attorney, Agent, or Firm*—Wolf, Greenfield & Sacks, P.C.

[57] ABSTRACT

In a method and an apparatus for the flux-free application of a solder to a substrate or a chip an area on the surface of the substrate or on the pad of the chip, to which the solder is applied, is cleaned, to produce a surface which is suitable for soldering. Subsequently, the cleaned area is isolated from the surroundings by means of a protective gas, and finally the solder is applied to the cleaned, isolated area and remelted.

11 Claims, 4 Drawing Sheets

MULTI-WAVELENGTH LASER SOLDERING DEVICE WITH SUBSTRATE CLEANING BEAM

BACKGROUND OF THE INVENTION

1. Field of the Invention

The present invention refers to a method and an apparatus for the flux-free application of a solder to a substrate or a chip.

2. Description of Prior Art

In the prior art various methods are known by means of which solders can be applied to a substrate. The solder to be applied can be present in the form of so-called solder balls.

In one known method, solder balls are arranged on a substrate making use of a template. Subsequently, these solder balls are remelted making use of fluxes. When this method is used, the flux is applied to the substrate before the solder balls are applied so as to fix the solder balls on the substrate.

A further known method makes use of the screen printing technology. A soldering paste is here applied to the substrate by means of the screen printing technique. The soldering paste consists of fine solder balls and of a flux. When the soldering paste has been printed onto the substrate, remelting is carried out in a furnace.

The above-described screen printing method according to the prior art is disadvantageous insofar as the possibility of using the method for soldering in the so-called fine-pitch range is limited.

The use of a flux leads to increased environmental pollution when the methods described hereinbefore are used.

When aluminium is to be soldered, the oxidized surface must be cleaned prior to the soldering process, since soldering on aluminium oxide is not possible. This cleaning by means of etching is a very expensive process step.

This problem arises especially in connection with chip contacting, when the contacting is to be carried out not by means of the known bonded connections, but when a soldered connection is desired. Conventional chips are provided with so-called pads or contact pads which consist of aluminium. Although a bonded connection with these aluminium pads can be established by means of bonding wires, the production of a soldered connection requires a metallization of the initial pad with solderable metals, such as gold. Direct, soldered contacting of the chip on the aluminium pads is not possible due to the oxidation occurring, i.e. the formation of an aluminium oxide layer on the pad. The use of a flux cannot solve this problem either.

SUMMARY OF THE INVENTION

It is the object of the present invention to provide a method and an apparatus by means of which solders can be applied to the surface of a substrate without making use of fluxes or by means of which a solder can be applied directly to the pads of a chip without making use of fluxes.

The present invention provides a method for the flux-free application of a solder to a substrate or a chip.

In the first step, an area on a surface of the substrate or a pad of the chip to which the solder is applied is cleaned. Subsequently, the cleaned area is isolated from the surroundings by means of a protective gas prior to applying the solder to the cleaned, isolated area.

The steps of cleaning and isolating the cleaned area may be carried out at the same time so that it is guaranteed that a renewed contamination of the cleaned area, which may occur already in the course of the cleaning process, is excluded.

The solder may be present in solid form, e.g. in the form of so-called solder balls. In this case, the application of the solder to the cleaned, isolated area comprises the step of arranging the solid solder on the area and the step of melting or rather remelting the solid solder.

The present invention provides an apparatus for the flux-free application of a solder to a substrate or a chip. The apparatus includes a laser light source, a deflection means for directing the laser beam, which has been produced by the laser light source, onto a frequency multiplication device, a reservoir unit containing the solder in solid form, a protective gas source, means with the aid of which the reservoir unit and the protective gas source are effectively connected to an area on a surface of the substrate or to a pad of the chip, to which the solder can be applied, a control unit by means of which the deflection means is caused to direct the laser beam onto the frequency multiplication device so as to produce the first laser beam which is directed onto the surface area of the substrate or onto the pad of the chip, and by means of which the protective gas source is caused to direct a protective gas onto the surface area of the substrate or onto the pad of the chip, the control unit interrupting the first laser beam when the area on the surface of the substrate or the pad of the chip has been cleaned, the reservoir unit is caused to release the solid solder, and the deflection means is caused to direct the laser beam straight onto the surface area of the substrate or onto the pad of the chip, on which the solid solder is arranged, so as to remelt the solid solder.

The present invention provides an apparatus for the flux-free application of a solder to a substrate or a chip. The apparatus includes a first laser light source emitting a first laser beam with a first wavelength, a second laser light source emitting a second laser beam with a second wavelength, a reservoir unit containing the solder in solid form; a protective gas source, means with the aid of which the reservoir unit and the protective gas source are effectively connected to an area on a surface of the substrate or to a pad of the chip, to which the solder can be applied, a control unit by means of which the first laser light source is caused to direct the first laser beam onto the surface area of the substrate or onto the pad of the chip, and by means of which the protective gas source is caused to direct a protective gas onto the surface area of the substrate or onto the pad of the chip, the control unit interrupting the first laser beam when the area on the surface of the substrate or the pad of the chip has been cleaned, the reservoir unit is caused to release the solid solder, and the second laser light source is caused to direct the second laser beam onto the area on the surface of the substrate or onto the pad of the chip, on which the solid solder is arranged, so as to remelt the solid solder.

The solid solder may be present in the form of so-called solder balls.

The above and other objects, features, aspects and advantages of the present invention will become more apparent from the following description of the embodiments with reference to the accompanying drawings:

BRIEF DESCRIPTION OF PREFERRED EMBODIMENT

DESCRIPTION OF THE PREFERRED EMBODIMENTS

Figure 1:
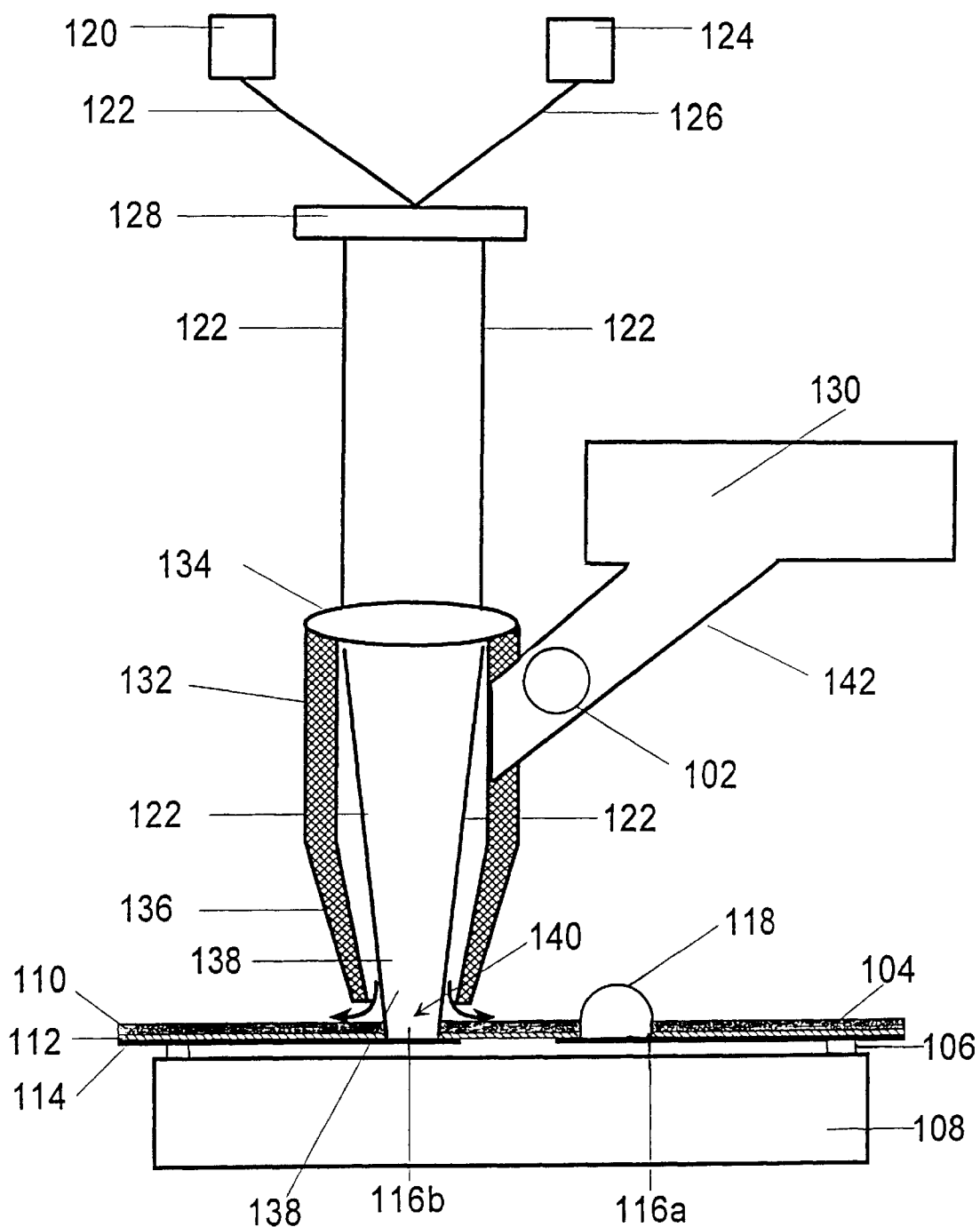
FIG. 1 shows an apparatus according to the present invention prior to the application of the solder to the surface of a substrate, according to a first embodiment.

With regard to the description of the apparatus according to the present invention and the method according to the present invention following hereinbelow, reference is made to the fact that, in the drawings, identical reference numerals have been used to designate identical elements.

In the method and the apparatus according to the present invention which will be described hereinbelow, the surface of a substrate, which is e.g. coated with copper or which consists of copper, is tinned with solder balls or provided with solder humps. The apparatus according to the present invention is also referred to as μBGA system (BGA=Ball Grid Array).

FIG. 1 shows a first embodiment of the apparatus 100 according to the present invention for the flux-free application of a solder 102 to a substrate 104. In the embodiment shown in FIG. 1, the substrate 104 is secured to a chip 108 via fastening bumps 106. The substrate 104 essentially consists of a first layer 110 consisting e.g. of a metal (copper, for example). Furthermore, the substrate 104 includes a second layer 112 as an insulation layer. On the surface of the substrate 104 facing the chip 108, a structured connecting-lead layer 114 is arranged; in the present example, this connecting-lead layer 114 connects the chip 108 via the bumps 106 and via the structured connecting leads 114 to an external circuit. As can be seen in FIG. 1, the substrate 104 is structured as well, and it is provided with a plurality of openings 116a, 116b. In the embodiment shown in FIG. 1, these openings serve as soldering points, this being shown at 118, by way of example, where a solder ball is already connected to the connecting-lead layer 114 via the opening 116a.

With regard to the substrate described hereinbefore and with regard to the combination of the substrate 104 and the chip 108, reference is made to the fact that the special structural design of the substrate 104 can also be realized by ablation by means of a laser.

In the following, the apparatus according to the present invention will be described more precisely.

The apparatus 100 for carrying out a surface treatment and for the flux-free application of a solder includes a first laser light source 120 emitting a first laser beam 122 having a first wavelength. Furthermore, a second laser light source 124 is provided for emitting a second laser beam 126. Making use of a suitable deflection device 128, switching over can be carried out between the first laser light source 120 and the second laser light source 124. The necessary control of the apparatus 100 is effected via a control means (not shown).

It is pointed out that the laser light sources 120, 124, the laser beams 122, 126 as well as the deflection device 128 are only shown in principle. Such means are known to those skilled in the art. Hence, these elements are not explained in detail.

The apparatus 100 according to the present invention additionally comprises a reservoir 130 as well as a protective gas source. In the embodiment shown in FIG. 1, the reservoir unit 130 and the protective gas source form a unit. However, these two elements can, of course, also be implemented as separate units.

A connection element 132 serves essentially for the purpose of connecting the reservoir and the protective gas source effectively to an area on a surface of the substrate 104.

In the embodiment shown in FIG. 1, the connection element 132 includes a lens 134 at the end facing away from the substrate 104. As can be seen in FIG. 1, the connection element 132 includes a tapering section 136. This tapering section 136 has a structural design of such a nature that an opening 138, which is located adjacent the surface of the substrate 104, has a smaller diameter than the opposite end of the connection element 132 at which the lens 134 is secured in position. In the embodiment shown in FIG. 1, the lens 134 serves to focus or to direct the laser beam 122, which originates from the first laser light source 120 in the example shown in FIG. 1, onto the area 140 on which the solder ball 102 is to be arranged.

As can be seen in FIG. 1, the protective gas source and the reservoir 130 are connected to the connection element 132 via a connecting piece 142.

As has already been stated, the apparatus 100 is controlled by means of a control unit, which is not shown. This control unit causes the first laser light source 120 to direct the first laser beam 122 onto the surface area 140 of the substrate 104 (as can be seen in FIG. 1). The first laser light source preferably produces a laser beam having a wavelength of 226 nm. This first laser beam has a short pulse length (in the nanosecond region) as well as a high energy density. By means of the first laser beam the surface 110 of the substrate 104 is cleaned (ablation). Contamination layers are removed from the surface of the metal (copper) by the etching carried out by means of the first laser beam 122, whereby a surface is produced that is suitable for soldering. The advantage is to be seen in the fact that a negative influence which the contamination layers may have on the wetting properties of the solder is eliminated. In order to avoid a renewed contamination of the surface which has just been cleaned, the cleaned area 140 is sealed from the surroundings by means of a protective gas. This protective gas is preferably a so-called inert gas. Depending on the surface to be cleaned, it may be desirable to start the protective gas flow already during the cleaning of the surface or to clean the surface while using the protective gas simultaneously if a fast renewed contamination of the surface has to be reckoned with. For surfaces in the case of which a renewed contamination does not occur within a short period of time, it will suffice to seal the cleaned area hermetically from the surroundings only after the cleaning has been finished, the sealing being effected by means of the protective gas or inert gas.

As soon as the area 140 on which the solder ball 102 is to be arranged has been cleaned, the control unit interrupts the first laser beam 122. When the surface area 140 has been cleaned, a solid solder is released by the reservoir 130, the solid solder being a solder ball 102 in the embodiment shown in FIG. 1. The reservoir 130 may, for example, be provided with a one-at-a-time feed unit which serves to release, depending on the area to be soldered, solder balls having the appropriate dimensions or solder, in an appropriate amount. This one-at-a-time feed unit may, for example, be realized by a screw conveyor or by a perforated disk.

In the embodiment shown in FIG. 1, the solder ball 102 is fed to the area 140 via the connection element 132 due to the pressure of the protective gas which still isolates the area 140. Reference is again made to the fact that, according to the embodiment described in connection with FIG. 1, the reservoir 130 and the protective gas source are implemented as a unit so that the solder ball 102 can easily be arranged on the area 140 by means of the pressure of the protective gas. In other embodiments of the apparatus according to the present invention, where the protective gas source and the reservoir are separate units, the solder ball 102 can be arranged on the area 140 e.g. by driving the solder balls 102 making use of ultrasonic sound.

According to a preferred embodiment, the reservoir 130 is provided with a device by means of which the solder balls contained in the reservoir can be acted upon by ultrasonic energy. This is advantageous insofar as, due to the fact that the solder ball is acted upon by ultrasonic sound, an oxide skin on the surface of the solder ball is already broken up and removed before the solder ball leaves the reservoir.

Figure 2:
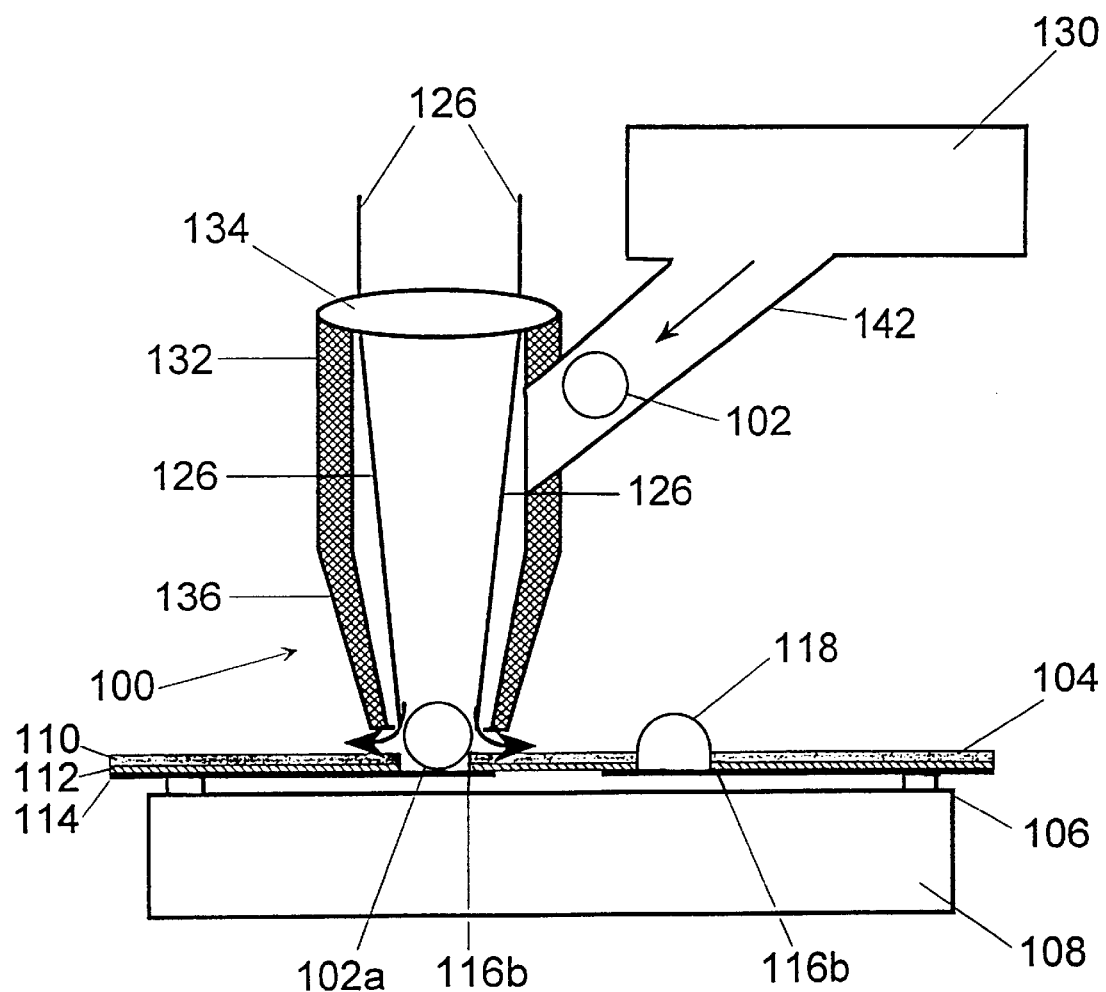
FIG. 2 shows the apparatus according to the present invention after the arrangement of the solder on the surface of the substrate, according to the first embodiment.

The further description of the preferred embodiment of the apparatus according to the present invention is now based on FIG. 2.

When the solder ball 102 (FIG. 1) has been released, it is arranged on the area 140 (FIG. 1). The resultant situation is shown in FIG. 2 where the solder ball 102a is arranged on the substrate 104. The control unit of the apparatus according to the present invention now causes the second laser light source 124 (FIG. 1; not shown in FIG. 2) to direct the second laser beam 126 onto the area to be soldered, i.e. onto the area having arranged thereon the solder ball 102a. The second laser beam preferably has a wavelength of 1064 nm and causes the solid solder, which has the form of a solder ball 102a in the present case, to melt. The second laser beam has a pulse width in the millisecond region. It is pointed out that, as indicated by the arrows at the lower end of the connection element 132, the protective gas flow can be maintained also during the melting process of the solder ball 102a. Hence, it is guaranteed that the cleaned surface of the substrate is sealed from the surroundings until the soldering process has been finished. This guarantees that a negative influence on the wetting properties of the solder or of the solder ball 102a, caused e.g. by newly forming contamination layers, is also excluded during the remelting process.

As has already been described on the basis of FIG. 1, switching over between the laser beams 122, 126 is carried out by means of a deflection device 128 which is also controlled by the control unit.

By means of the above-described preferred embodiment of the present invention, a flux-free application and remelting of solder balls 102 e.g. on copper surfaces 110 of a substrate 104 is possible.

In accordance with a further preferred embodiment, only one laser light source is provided instead of the two laser light sources described hereinbefore. In order to produce the above-described first laser beam for the cleaning process, this embodiment is additionally provided with a reflecting mirror directing the laser beam, which has been produced by the laser light source, onto a device, preferably a crystal 200, by means of which the frequency of the laser beam is doubled or quadrupled and the wavelength of the laser beam is, consequently, halved or quartered. Subsequently, the reflecting mirror causes the laser beam to be directed straight onto the substrate so as to provide the second laser beam for remelting the solder ball.

On the basis of FIG. 3 and 4, a further embodiment of the present invention will be described hereinbelow; according to this embodiment, a solder 102 is applied directly onto the pad 106 of a chip 108. It is pointed out that elements which are shown in FIG. 3 and 4 and which have already been described on the basis of FIG. 1 and 2 are designated by identical reference numerals and that they will not be described again.

As has already been described hereinbefore with reference to the prior art, the direct application of a solder 102 to the contact pads 106 is problematic due to the fact that oxidation of the aluminium used as a material for the pad occurs. The present invention provides the possibility of applying a solder directly onto the pad. FIG. 3 shows the cleaning (ablation) of the pad 106 of the chip 108 prior to the application of the solder 102. In FIG. 3, two pads 106 are already provided with a solder 118. As has already been described hereinbefore on the basis of FIG. 1, the cleaning is carried out by means of a first laser beam 122. A protective gas isolates the pad from the surroundings so as to prevent a renewed contamination, i.e. a renewed oxidation, of the pad.

Figure 4:
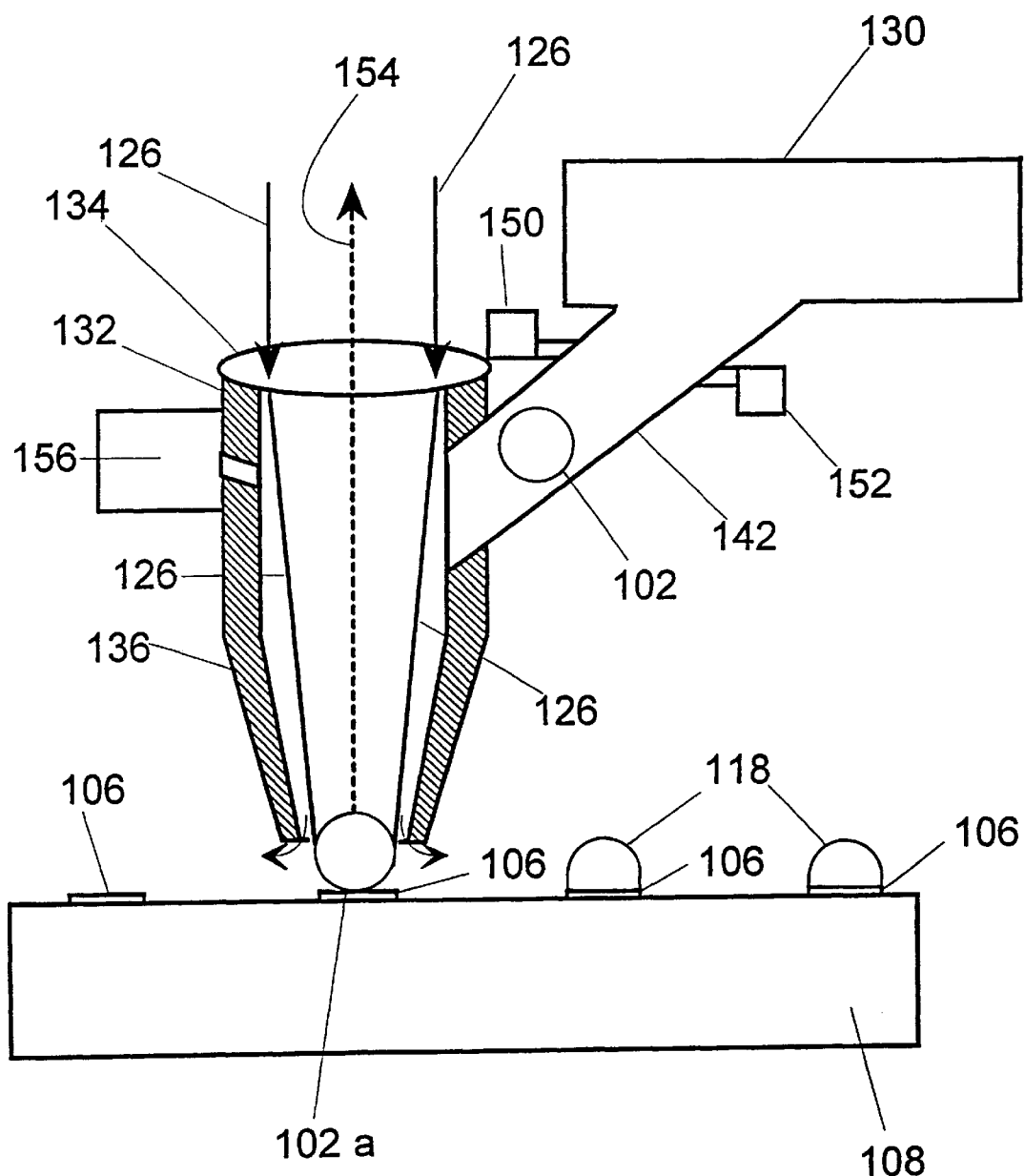
FIG. 4 shows the apparatus according to the present invention after the arrangement of the solder on the pad of the chip.

FIG. 4 shows the situation obtained after the cleaning of the pad 106 and the application of the solder 102. A solder 102a is arranged on the pad 106. A has already been described hereinbefore, the solder 102a is now remelted by means of the second laser beam 126.

Figure 3:
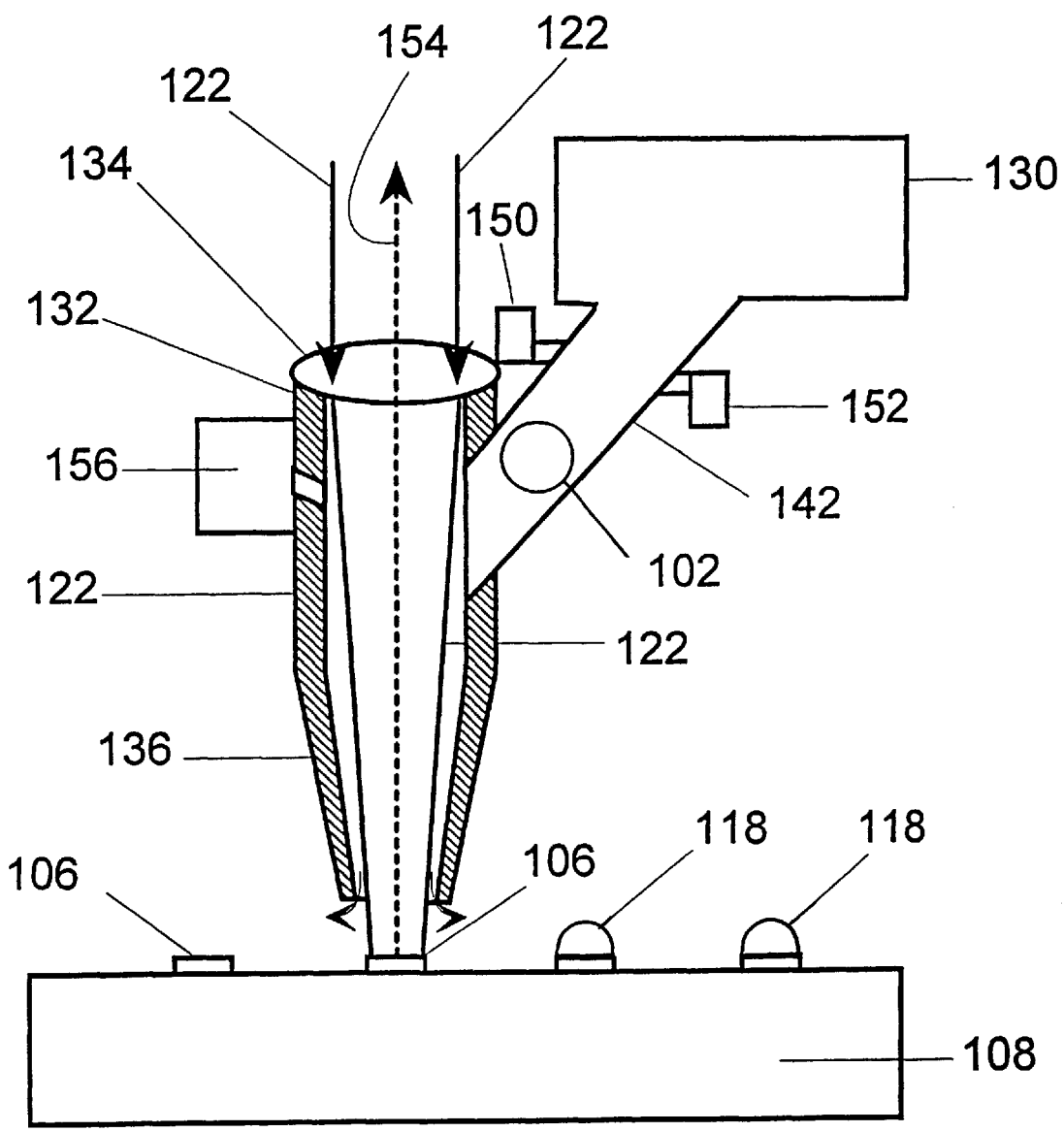
FIG. 3 shows the apparatus according to the present invention prior to the application of the solder to the pad of a chip, according to a further embodiment.

The embodiment shown in FIG. 3 and 4 comprises in addition to the elements described hereinbefore also a plurality of sensor elements. A first sensor element 150 is arranged on the connecting piece 142. By means of the sensor it is detected whether a solder ball is located in the perforated disk or at a discharge position of the screw conveyor. A second sensor element 152, which is also arranged on the connecting piece, serves to detect whether the solder ball 102 has left the reservoir 130. A third sensor element, which is not shown, detects a reflected portion of the laser light (schematically represented by arrow 154). By means of the reflected beam and the associated sensor, the quality of the cleaned area is determined during the cleaning operation (FIG. 3). Depending on the quality detected, it is determined whether the cleaning is already finished or whether it has to be continued. When the cleaning has been finished, the third sensor is used for determining whether the solder 102a is arranged on the pad 106. If this is the case, remelting is carried out by means of the second laser beam. The sensors described hereinbefore are implemented as optical sensors in accordance with a preferred embodiment. Instead of the third sensor element 154, a fourth sensor element 156 can be provided, which is implemented as a pressure sensor. This sensor element serves to detect in the interior of the connection element 132 the pressure of the protective gas supplied. If a solder ball 102a is located on the surface to be soldered, the pressure in the connection element will increase so that the presence of a solder ball can be determined on the basis of this increase in pressure.

According to a further embodiment, the fourth sensor element 156 can be provided in addition to the third sensor element 152. In this case, the sensor element additionally serves to control the pressure of the protective gas in the connecting piece 142. A partial vacuum can, for example, be produced for removing from the connecting piece a solder ball that sticks therein. It is also possible to adjust an overpressure so as to blow excessive solder material out of the connecting piece for cleaning the apparatus e.g. after the execution of a soldering operation.

The above-described evaluation of the solder ball positions and of the quality of the cleaned surface, which are detected by the sensors, is carried out by means of the control unit (not shown).

The sensors described hereinbefore can, of course, also be used in the embodiment described on the basis of FIG. 1 and 2, although they are not shown in FIG. 1 and 2.

Although so-called solder balls have been referred to in the above description of the preferred embodiments of the present invention, it is pointed out that also other solid solders can be used for these embodiments.

Reference is made to the fact that, on the basis of the drawings enclosed, only preferred embodiments of the present invention have been described. The essential features of the method according to the present invention, which is used for the flux-free application of a solder to a substrate 104 or to a chip 108, consist of the cleaning of the area 140 on the substrate surface 110 or the chip pad 106, the isolation of the cleaned area by means of a protective gas, and the application of a solder to the cleaned, isolated area 140.

In this connection it must be emphasized that, in the case of some embodiments of the method according to the present invention, the cleaning and isolating steps are carried out at the same time or very nearly the same time. This guarantees that also areas which have already been cleaned are isolated from the surroundings while the cleaning operation is still continued.

In accordance with another preferred embodiment, the solder is not provided in liquid, but in solid form. In this case, the application is carried out in such a way that the solid solder is first arranged on the cleaned area 140 and then melted.

What is claimed is:

1. An apparatus for the flux-free application of a solder to a substrate or a chip, comprising
   a laser light source for emitting a laser beam;
   a deflection means for directing the laser beam, which has been produced by the laser light source, onto a frequency multiplication device;
   a reservoir feed unit containing the solder in solid form;
   a protective gas source;
   means with the aid of which the reservoir unit and the protective gas source are effectively connected to an area on a surface of the substrate or to a pad of the chip, to which the solder can be applied; and
   a control unit by means of which
      the deflection means is caused to direct the laser beam onto the frequency multiplication device so as to produce the first laser beam which is directed onto the surface area of the substrate or onto the pad of the chip, and by means of which the protective gas source is caused to direct a protective gas onto the surface area of the substrate or onto the pad of the chip, said control unit interrupting the first laser beam when the area on the surface of the substrate or the pad of the chip has been cleaned;
      the reservoir unit is caused to release the solid solder; and
      the deflection means is caused to direct the laser beam straight onto the surface area of the substrate or onto the pad of the chip, on which the solid solder is arranged, so as to remelt said solid solder.

2. An apparatus according to claim 1, wherein the solder consists of solder balls.

3. An apparatus according to claim 1, wherein the reservoir unit comprises a one-at-a-time feed unit.

4. An apparatus according to claim 3, wherein the one-at-a-time feed unit comprises a screw conveyor or a perforated disk.

5. An apparatus according to claim 1, further comprising
   a first sensor means which detects whether a solder ball is located in the perforated disk or at a discharge position of the screw conveyor;
   a second sensor means which detects whether the solder ball has left the reservoir; and
   a third sensor means which detects a reflected portion of the laser light and which determines on the basis of the reflected beam the quality of the cleaned area and the position of the solder on the cleaned area.

6. An apparatus according to claim 5, wherein the first, second an third sensor means are optical sensors.

7. An apparatus according to claim 1, further comprising a fourth sensor means which detects and controls the pressure in the connecting means.

8. An apparatus for the flux-free application of a solder to a substrate or a chip, comprising
   a first laser light source emitting a first laser beam with a first wavelength;
   a second laser light source emitting a second laser beam with a second wavelength;
   a reservoir unit containing the solder in solid form;
   a protective gas source;
   means with the aid of which the reservoir unit and the protective gas source are effectively connected to an area on a surface of the substrate or to the pad of the chip, to which the solder can be applied; and
   a control unit by means of which
      the first laser light source is caused to direct the first laser beam onto the surface area of the substrate or onto the pad of the chip, and by means of which the protective gas source is caused to direct a protective gas onto the surface area of the substrate or onto the pad of the chip, said control unit interrupting the first laser beam when the area on the surface of the substrate or the pad of the chip has been pretreated and/or cleaned;
      the reservoir unit is caused to release the solid solder; and
      the second laser light source is caused to direct the second laser beam onto the area on the surface of the substrate or onto the pad of the chip, on which the solid solder is arranged, so as to remelt said solid solder.

9. An apparatus according to claim 8, further comprising
   a first sensor means which detects whether a solder ball is located in the perforated disk or at a discharge position of the screw conveyor;
   a second sensor means which detects whether the solder ball has left the reservoir; and
   a third sensor means which detects a reflected portion of the laser light and which determines on the basis of the reflected beam the quality of the cleaned area and the position of the solder on the cleaned area.

10. An apparatus according to claim 9, wherein the first, second an third sensor means are optical sensors.

11. An apparatus according to claim 8, further comprising a fourth sensor means which detects and controls the pressure in the connecting means.

* * * * *